United States Patent
Li

(10) Patent No.: US 12,464,756 B2
(45) Date of Patent: *Nov. 4, 2025

(54) HIGH ELECTRON MOBILITY TRANSISTOR (HEMT) AND METHOD OF MANUFACTURING THE SAME

(71) Applicant: GUANGDONG ZHINENG TECHNOLOGIES, CO. LTD., Guangdong (CN)

(72) Inventor: Zilan Li, Guangdong (CN)

(73) Assignee: GUANGDONG ZHINENG TECHNOLOGIES, CO. LTD., Guangdong (CN)

( * ) Notice: Subject to any disclaimer, the term of this patent is extended or adjusted under 35 U.S.C. 154(b) by 945 days.

This patent is subject to a terminal disclaimer.

(21) Appl. No.: 17/603,294

(22) PCT Filed: Sep. 30, 2019

(86) PCT No.: PCT/CN2019/109383
§ 371 (c)(1),
(2) Date: Oct. 12, 2021

(87) PCT Pub. No.: WO2020/206960
PCT Pub. Date: Oct. 15, 2020

(65) Prior Publication Data
US 2022/0223726 A1    Jul. 14, 2022

(30) Foreign Application Priority Data
Apr. 12, 2019   (CN) .......................... 201910291624.6

(51) Int. Cl.
*H10D 30/47*   (2025.01)
*H10D 30/01*   (2025.01)
(Continued)

(52) U.S. Cl.
CPC ......... *H10D 30/475* (2025.01); *H10D 30/015* (2025.01); *H10D 30/477* (2025.01);
(Continued)

(58) Field of Classification Search
CPC ............. H01L 29/7786; H01L 29/1608; H01L 29/2003; H01L 29/402; H01L 29/66462;
(Continued)

(56) References Cited

U.S. PATENT DOCUMENTS 9,728,630 B2 * 8/2017 Prechtl ................ H01L 29/2003
10,629,720 B2 * 4/2020 Jiang ................... H01L 29/0657
(Continued)

FOREIGN PATENT DOCUMENTS

CN   105679823 A   6/2016
CN   108780811 A   11/2018
(Continued)

*Primary Examiner* — William B Partridge
*Assistant Examiner* — Linda J. Fleck
(74) *Attorney, Agent, or Firm* — Seed IP Law Group LLP

(57) ABSTRACT

The present disclosure relates to a HEMT, which comprises a vertical interface; a channel layer disposed outside of the vertical interface; a channel supply layer disposed outside of the channel layer, wherein a vertical 2 DEG is formed in the channel layer adjacent to an interface between the channel layer and the channel supply layer; a first electrode configured to be electrically connected to the vertical 2 DEG; a second electrode configured to be electrically connected to the vertical 2 DEG; a gate electrode disposed outside of the channel supply layer. The present disclosure also relates to a method of manufacturing a HEMT, which comprises forming a vertical interface; forming a channel layer outside of the vertical interface; forming a channel supply layer outside the channel layer, wherein a vertical 2 DEG is formed in the channel layer adjacent to an interface between the channel layer and the channel supply layer; and forming (Continued)

a first electrode and a second electrode which are electrically connected to the 2 DEG, and a gate electrode which form schottky contact to the 2 DEG.

27 Claims, 13 Drawing Sheets

(51) Int. Cl.
  *H10D 62/832* (2025.01)
  *H10D 62/85* (2025.01)
  *H10D 64/00* (2025.01)
(52) U.S. Cl.
  CPC ..... *H10D 62/8325* (2025.01); *H10D 62/8503* (2025.01); *H10D 64/111* (2025.01)
(58) Field of Classification Search
  CPC ............. H01L 29/7788; H01L 29/7789; H01L 29/045; H01L 29/0657; H01L 29/41741; H01L 29/42316; H01L 29/0615; H01L 29/0684; H01L 29/66795; H01L 29/7855; H01L 21/8252; H01L 27/0605; H01L 27/085; H01L 27/092; H01L 21/823885; H10D 30/475; H10D 30/015; H10D 30/477; H10D 30/478; H10D 30/024; H10D 30/6215; H10D 62/8325; H10D 62/8503; H10D 64/111; H10D 64/411; H10D 64/252; H10D 84/82; H10D 84/85; H10D 84/01; H10D 84/0195; H10D 84/038; H10D 84/05; H10D 62/105; H10D 62/124
  See application file for complete search history.

(56) References Cited

U.S. PATENT DOCUMENTS

| | | | | |
|---|---|---|---|---|
| 11,205,704 | B2* | 12/2021 | Tsunami | H01L 29/401 |
| 11,830,940 | B2* | 11/2023 | Li | H01L 29/1608 |
| 2005/0208769 | A1* | 9/2005 | Sharma | H01L 21/32134 |
| | | | | 257/E21.309 |
| 2006/0065912 | A1* | 3/2006 | Beach | H01L 29/7787 |
| | | | | 257/E29.05 |
| 2007/0295993 | A1* | 12/2007 | Chen | H01L 29/2003 |
| | | | | 257/E29.252 |
| 2012/0043586 | A1* | 2/2012 | Nishimori | H01L 29/0657 |
| | | | | 257/E21.403 |
| 2012/0211800 | A1* | 8/2012 | Boutros | H01L 29/4175 |
| | | | | 257/E29.317 |
| 2013/0056793 | A1* | 3/2013 | Srinivasan | H01L 21/0262 |
| | | | | 257/E29.081 |
| 2013/0234207 | A1* | 9/2013 | Choi | H10D 30/015 |
| | | | | 257/194 |
| 2014/0091366 | A1* | 4/2014 | Jeon | H01L 21/8252 |
| | | | | 257/195 |
| 2015/0014700 | A1* | 1/2015 | Khalil | H01L 21/30612 |
| | | | | 438/285 |
| 2015/0048421 | A1* | 2/2015 | Park | H01L 29/66462 |
| | | | | 257/194 |
| 2016/0118491 | A1* | 4/2016 | Okita | H10D 30/478 |
| | | | | 257/192 |
| 2016/0380154 | A1* | 12/2016 | Machuca | H01L 29/7788 |
| | | | | 257/99 |
| 2017/0033187 | A1* | 2/2017 | Rajan | H01L 29/8611 |
| 2017/0186700 | A1* | 6/2017 | Zhao | H01L 23/3735 |
| 2017/0222047 | A1 | 8/2017 | Conway et al. | |
| 2018/0294362 | A1* | 10/2018 | Fukui | H01L 29/78642 |
| 2020/0119179 | A1* | 4/2020 | Mishra | H01L 29/1037 |
| 2020/0203488 | A1* | 6/2020 | Then | H03F 7/0169 |
| 2020/0251582 | A1* | 8/2020 | Li | H01L 21/823431 |
| 2020/0328288 | A1* | 10/2020 | Chou | H01L 29/7787 |
| 2021/0091219 | A1* | 3/2021 | Patti | H10D 30/478 |
| 2022/0199818 | A1* | 6/2022 | Li | H01L 29/7786 |
| 2022/0246751 | A1* | 8/2022 | Chang | H10D 62/221 |

FOREIGN PATENT DOCUMENTS

| | | |
|---|---|---|
| CN | 109360786 A | 2/2019 |
| CN | 110224019 A | 9/2019 |
| WO | WO 2018125211 A1 | 7/2018 |

* cited by examiner

HIGH ELECTRON MOBILITY TRANSISTOR (HEMT) AND METHOD OF MANUFACTURING THE SAME

FIELD OF THE DISCLOSURE

The present disclosure relates to the technical field of semiconductors, and in particular to a high electron mobility transistor (HEMT) and a method of manufacturing the same.

BACKGROUND OF THE DISCLOSURE

Group III nitride semiconductors, including AlN, GaN, InN and compounds of these materials such as AlGaN, InGaN, AlInGaN and the like are important semiconductor materials. Due to their advantages like direct band gap, wide forbidden band and high breakdown electric field intensity, Group III nitride semiconductors represented by GaN have broad application prospects in the fields of light-emitting devices, power electronics and radio frequency devices.

Unlike conventional non-polar semiconductor materials such as Si, Group III nitride semiconductors have polarity. In other words, they are polar semiconductor materials. Polar semiconductors have many unique properties. Particularly importantly, fixed polarized charges are present at a surface of the polar semiconductor or at an interface of two different polar semiconductors. These fixed polarized charges may attract movable electrons or hole carriers and thus form the two-dimensional electron gas (2 DEG) or the two-dimensional hole gas (2DHG). The generation of 2 DEG or 2DHG neither requires an additional electric field, nor depends on a doping effect in the semiconductor. It is spontaneously generated. The 2 DEG or 2DHG at the interface of the polar semiconductors may have a high surface charge density. Meanwhile, without doping, the 2 DEG or the 2DHG has high mobility because of reduction of ion scattering effect and so on that the 2 DEG or the 2DHG is usually subjected to undertake. The high density of the surface charge and high mobility enable the 2 DEG or 2DHG spontaneously generated at those interfaces to have good conductivity and high response speed.

In combination with inherent advantages of the nitride semiconductor such as high breakdown electric field and so on, the 2 DEG or 2DHG may be used to manufacture a high electron mobility transistor (HEMT) or a high hole mobility transistor (HHMT). Their performances in high energy, high voltage or high frequency applications are significantly better than those traditional Si or GaAs devices. However, existing structures have many defects, which seriously restricts their application ranges.

BRIEF SUMMARY

This disclosure relates to a high electron mobility transistor (HEMT), comprising: a vertical interface; a channel layer disposed outside the vertical interface; a channel supply layer disposed outside the channel layer, wherein a vertical 2 DEG is formed in the channel layer adjacent to an interface between the channel layer and the channel supply layer; a first electrode configured to be electrically connected to the vertical 2 DEG; a second electrode configured to be electrically connected to the vertical 2 DEG; a gate electrode disposed outside the channel supply layer.

In the HEMT as described herein, wherein the first electrode or the second electrode form an ohmic contact with the channel supply layer.

In the HEMT as described herein, wherein the vertical interface is a (111) plane of Si, a (0001) plane of $Al_2O_3$ of sapphire, a (0001) plane or a (000-1) plane of SiC, or a (0001) plane of the GaN intrinsic substrate.

In the HEMT as described herein, wherein the first electrode, the second electrode, and the gate electrode are at the same side of the 2 DEG.

In the HEMT as described herein, wherein the first electrode, the second electrode, and the gate electrode are at the same height of level or at the same place of vertical.

In the HEMT as described herein, wherein the first electrode and the second electrode, and the gate electrode are at the different sides of the 2 DEG.

In the HEMT as described herein, the first electrode extends under the channel layer.

In the HEMT as described herein, the first electrode is a drain electrode.

In the HEMT as described herein, the second electrode extends on the channel layer.

In the HEMT as described herein, the second electrode is a source electrode.

In the HEMT as described herein, it further comprises a nucleation layer on the vertical interface of the substrate.

In the HEMT as described herein, it further comprises a buffer layer located between the nucleation layer and the channel layer.

In the HEMT as described herein, it further comprises a shielding layer, formed on the channel layer side which is nonadjacent to the 2 DEG.

In the HEMT as described herein, it further comprises an insulating layer extends under the channel layer and the channel supply layer.

In the HEMT as described herein, it further comprises a gate insulating layer between the channel supply layer and the gate electrode.

According to further another aspect of the present disclosure, it provides a HEMT, comprising: a column, comprising, on at least one side, a vertically extending channel layer and a vertically extending channel supply layer, wherein a vertical 2 DEG is formed in the channel layer adjacent to an interface between the channel layer and the channel supply layer; a first electrode having an ohmic contact with the column and electrically connected to the vertical 2 DEG; a second electrode having an ohmic contact with the column and electrically connected to the vertical 2 DEG; a third electrode, disposed outside of the column.

In the HEMT as described herein, the first electrode or the second electrode is a source electrode or a drain electrode.

In the HEMT as described herein, it further comprises a gate insulating layer between the channel supply layer and the gate electrode.

In the HEMT as described herein, the first electrode, the second electrode and the third electrode are on the side of the column.

In the HEMT as described herein, the first electrode is on the top of the column.

In the HEMT as described herein, the second electrode is on the bottom of the column.

In the HEMT as described herein, the area of the second electrode is larger than the bottom area of the column.

According to another aspect of the present disclosure, it provides a method of manufacturing a HEMT, comprising the steps of: forming a vertical interface; forming a channel layer outside the vertical interface; and forming a channel supply layer outside the channel layer, wherein a vertical 2 DEG is formed in the channel layer adjacent to an interface between the channel layer and the channel supply layer; and forming a first electrode and a second electrode electrically connected to the 2 DEG, and a gate electrode outside the channel supply layer.

In the method as described herein, wherein the vertical interface is formed on the substrate.

In the method as described herein, it further comprises forming a gate insulating layer between a channel supply layer and the gate electrode.

In the method as described herein, wherein before forming a first electrode and a second electrode electrically connected to the 2 DEG, it comprises transversely etching the channel supply layer or transversely etching the channel supply layer and a part of the channel layer.

In the method as described herein, it further comprises forming a nucleation layer on the vertical interface, wherein aerating Chlorine-containing gas while forming the nucleation layer.

In the method as described herein, it further comprises forming the second electrode and the gate electrode electrically connected to the 2 DEG; wiping off the substrate of part of the substrate; and forming the first electrode under the channel layer and the channel supply layer.

DETAILED DESCRIPTION OF THE EMBODIMENT(S) OF THE DISCLOSURE

Figure 1:
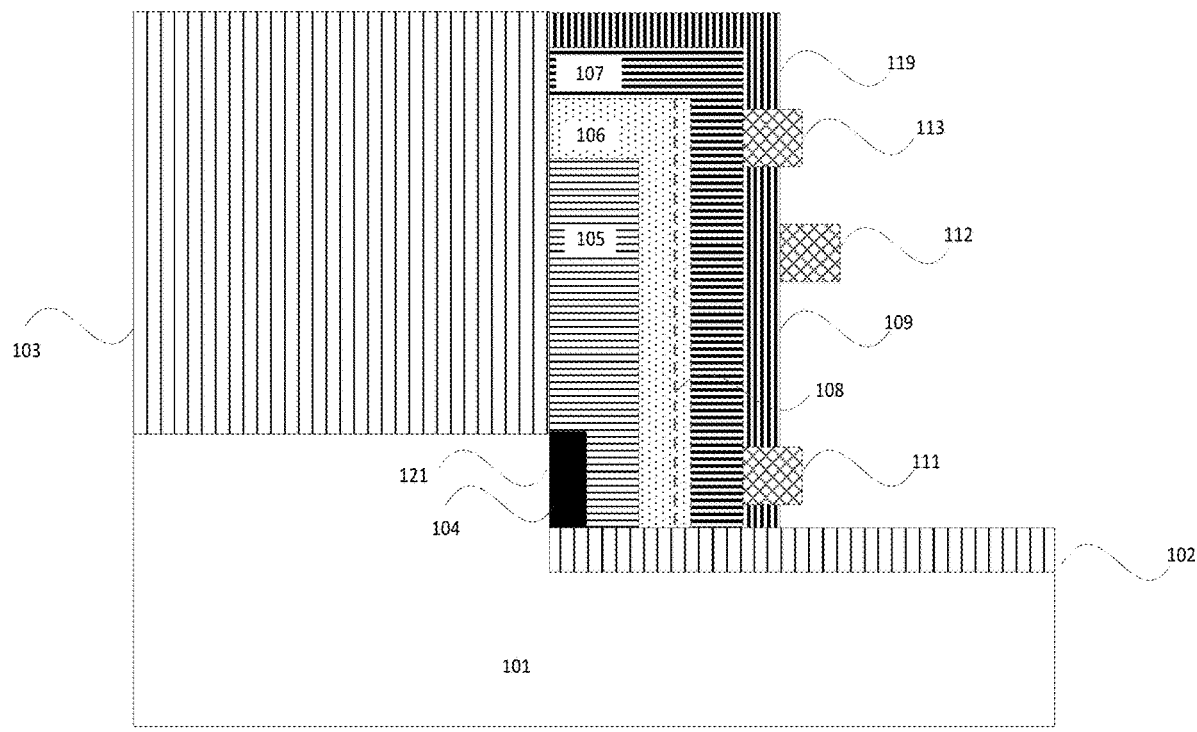
FIG. 1 is a schematic diagram of a HEMT according to an embodiment of the present disclosure.

In order that the objects, technical solutions and advantages of the embodiments of the present disclosure will become clearer, technical solutions in the embodiments of the present disclosure will be described clearly and completely below in conjunction with the drawings in the embodiments of the present disclosure. Apparently, the described embodiments are some of the embodiments of the present disclosure, not all of them. All the other embodiments obtained by those skilled in the art based on the embodiments of the present disclosure without creative efforts will fall within the scope of the present disclosure.

In the following detailed description, reference may be made to various drawings which constitute a part of the present application and serve to explain the present application. In the drawings, similar reference signs denote substantially similar components in different FIGs. The individual specific embodiments of the present application will be described in sufficient detail below to enable those of ordinary knowledge and skills in the art to carry out the technical solutions of the present application. It is understood that other embodiments may be utilized, or structural, logical or electrical changes may be made to the embodiments of the present application.

This disclosure provides a HEMT with a vertical channel structure. FIG. 1 is a schematic view of a HEMT according to an embodiment of the present disclosure. As shown in the figure, a HEMT 100 comprises substrate 101. Substrate 101 includes two areas 120 and 130 which are in different heights. The two areas 120 and 130 form a step-shape structure. Inherently, a vertical interface 121 is generated between area 120 and area 130.

With a vertical interface formed on substrate 101 is beneficial to design of manufacturing technology, and thus it is a better embodiment of the present disclosure. However, this disclosure is not limited herein. In some embodiments, the vertical interface 121 may not be formed on the substrate 101. For example, growing crystal by vertical orientation on the substrate or etching the structure that already formed on the substrate may also be used to form the vertical interface 121.

The lattices of the vertical interface 121 have a hexagonal symmetry. For instance, the interface may be the plane of Si, the (0001) plane of $Al_2O_3$ of sapphire, the (0001) plane or the (000-1) plane of SiC, and the (0001) plane of the GaN intrinsic substrate. Further, when the vertical interface formed on the substrate, the substrate may be the corresponding Si substrate, the $Al_2O_3$ sapphire substrate, the SiC substrate, or the GaN intrinsic substrate.

HEMT 100 further comprises a channel layer 106 and a channel supply layer 107 outside of the vertical interface 121. The channel layer 105 is closer to the vertical interface 121. In some embodiments, the height of the channel layer 106 is higher than the vertical interface 121. The channel supply layer 107 grows outside of the channel layer 106. In the channel layer 106, a vertical 2 DEG 108 is formed adjacent to an interface between the channel layer 106 and the channel supply layer 107.

In some embodiments, HEMT 100 also comprises a nucleation layer 104. The nucleation layer 104 grows on the vertical interface 121. For instance, the nucleation layer 104 can be AlN. In some embodiments, HEMT 100 also comprises a buffer layer 105. The buffer layer 105 grows on the nucleation layer 104. For instance, the buffer layer 105 may have single-layer structure or multi-layer structure, including one or more of AlN, GaN, AlGaN, InGaN, AlInN and AlGaInN. The channel layer 106 may grow on the nucleation layer 104 or the buffer layer 105.

HEMT 100 comprises a first electrode 111, a second electrode 113 and a third electrode 112. The first electrode 111 and the second electrode 113 are formed with ohmic contacts with the channel layer or the channel supply layer, and thus electrically connected to the 2 DEG 108.

In some embodiments, the first electrode 111, as the drain electrode, is disposed on a side of the channel layer 106 or the channel supply layer 107 adjacent to the substrate 101. The second electrode 113, as the source electrode, is disposed on another side of the channel layer 106 or the channel supply layer 107 nonadjacent to the substrate 101. Usually, the first electrode 111 as the drain electrode is connected to the high voltage. The second electrode 113 is designed away from the first electrode 111, which is beneficial to increase withstand voltage and reduce loss.

The third electrode 112, as the gate electrode, is disposed outside the channel supply layer 107. The third electrode 112, also called the gate electrode, controls the current intensity in the channel area between the first electrode 111 and the second electrode 113. In some embodiments, the third electrode 112 forms Schottky contact with the channel supply layer 107. In some embodiments, there may be other layers outside of the channel supply layer, such as a cap layer, a gate insulating layer and so on. The third electrode is contacted with the cap layer or the gate insulating layer, but not contacted directly with the channel supply layer 107. The voltage of the third electrode 112 can control depth of the heterojunction potential well formed by the channel layer-channel supply layer and density of surface charge of 2 DEG in the potential well, and therefore can control the working current between the first electrode and the second electrode in the HEMT 100.

In some embodiments, the third electrode 112 is located between the first electrode 111 and the second electrode 113 and is closer to the second electrode 113. In the case that the first electrode 111 as the drain is connected to high voltage, such arrangement increases the distance between the drain and the gate, which can effectively improve the withstanding voltage of high electron mobility transistors.

FIG. 1 shows an arrangement of three electrodes for the HEMT 100. The first electrode 111 is located at the bottom; the third electrode 112 is located above the first electrode 111; and the second electrode 113 is located above the third electrode 112. They occupy the same vertical position and only the third electrode 112 can be observed from above of the substrate 101. In this way, the chip area can be minimized, and the integration level can be improved. In some embodiments, the first electrode 111, the second electrode 113 and the third electrode 112 are arranged laterally with the same horizontal height. Such arrangement can facilitate lead connections. The first electrode 111 or the second electrode 113 may be the source or drain electrode.

As shown in FIG. 1, the first electrode 111 and the second electrode 113 were located outside of the channel layer 106. In some embodiments, the first electrode 111 and the second electrode 113 may also extend above or below the channel layer 106, respectively.

In some embodiments, an isolation layer 102 is included between the substrate 101 and the channel layer 106 and the channel supply layer 107. The isolation layer 102 extends horizontally and its material may be $SiO_2$ and other insulating materials. The isolation layer 102 spaces the HEMT 100 from substrate 101, which avoids adverse impact of the substrate 101 on device performance and results in significant increases in capability of enhancing withstand voltage and reducing dark current of the device.

In some embodiments, a shielding layer 103 is included on the side of channel layer 106 nonadjacent to 2 DEG 108. The presence of shielding layer 103 prevents formation of 2DHG on that side of channel layer 106. In some embodiments, the shielding layer 103 occupies most or nearly all of the area between the positions corresponding to the first electrode 111 and second electrode 113 on the side of channel layer 106 nonadjacent to 2 DEG, which spaces the substrate 101 from channel layer 106 horizontally. This further prevents adverse impact of the substrate 101 on device performance.

In some embodiments, the shielding layer 103 may encircle or partially encircle the channel layer 106 and the channel supply layer 107. For example, the shielding layer 103 may extend above the channel layer 106 and channel supply layer 107. Alternatively, the shielding layer 103 may cover the channel layer 106 and channel supply layer 107. This further spaces HEMT 100 and reduces the impact of other surrounding materials. In some embodiments, the shielding layer 103 may be made of insulating material such as $SiO_2$. The shielding layer 103 isolates or partially isolates the HEMT 100, significantly improving the withstand voltage and reducing dark current of the device.

In some embodiments, a gate insulating layer 109 may be included between the channel supply layer 107 and the third electrode 112. The gate insulation layer 109 separates the third electrode 112 from the channel supply layer 107, which can greatly reduce the leakage current between the third electrode 112 and the first electrode 111. Also, the gate insulation layer 109 can passivate the surface of channel supply layer 107, which can further improve working stability of the HEMT.

In some embodiments, a cap layer (e.g. AlGaN or GaN) may be included between the channel supply layer 107 and the third electrode 112. In some embodiments a passivation layer 119 may be included on the channel supply layer 107. For example, the passivated layer 119 may occupy the portions that covers by the channel supply layer and the gate electrode 112 between the first electrode 111 and the second electrode 113, thus providing protection to the internal channel layer 106 and the channel supply layer 107. In some embodiments, the material of the outer insulation layer 119 may be insulating materials such as SiN, $SiO_2$, etc. The cap layer and the passivation layer are helpful to reduce drain current collapse and maintain the 2 DEG generated by polarization characteristics. Also, it can also reduce the gate leakage current, prevent the channel supply layer 107 from cracking during the cooling process after growth, and enhance the source, drain ohmic contact and breakdown voltage.

According to some embodiments of the present disclosure, the substrate 101 material may be Si, SiC, intrinsic GaN or sapphire $Al_2O_3$. In some embodiments, the Si substrate is selected with a more mature process and lower cost than other materials. Si in the substrate will have a melt-back effect with GaN in channel layer 106, which will affect the growth of channel layer 106. Therefore, the nucleation layer 104, whose material can be AlN, is introduced to cover the vertical interface 121 of the Si substrate 101, so as to avoid the direct contact between Si in the Si substrate 101 and GaN in channel layer 106. Nucleation layer 104 may also exist but is not required when the substrate is a non-Si material.

In some embodiments, when the substrate 101 is a non-intrinsic GaN substrate, a buffer layer 105 is preferably introduced to reduce the impact of lattice differences. Buffer layer 105 can be one or more of AlN, GaN, AlGaN, InGaN, AlInN and AlGaInN, which can reduce the impacts of lattice constant and thermal expansion coefficient between the substrate 101 and channel layer 106, and effectively avoid nitride epitaxial layer cracking and other conditions. The buffer layer 105 is also an optional structure for the HEMT 100.

According to an embodiment of the present disclosure, the material of channel layer 106 may be GaN. According to an embodiment of the present disclosure, the material of the channel supply layer 107 may be AlGaN. The channel layer 106 and channel supply layer 107 may also be other materials as understood by persons skilled in the art as mentioned in the background, which is not repeated here.

Due to spontaneous polarization and piezoelectric polarization effects, there are strong polarization charges at the interface between channel layer 106 and channel supply layer 107. Those polarized charges attract and cause generation of 2 DEG or 2DHG at the interface. In some embodiments, the vertical interface 121 is the (111) plane of Si substrate, and the (0001) plane of GaN, etc., the channel supply layer 107 is only formed on the right side of channel layer 106, and HEMT 100 contains only 2 DEG 108. Similarly, if the vertical interface is a (000-1) plane of GaN, and the channel supply layer 107 is formed on the right side of channel layer 106, then a HHMT containing only 2DHG is formed. For another example, the vertical interface 121 is the (111) plane of Si substrate, the (0001) plane of GaN, etc., and the channel supply layer 107 is formed to the left of channel layer 106, thus HHMT containing only 2DHG is formed. For another example, the vertical interface 121 is the (111) plane of Si substrate, and the (0001) plane of GaN, etc., the channel supply layer 107 is formed on both sides of the channel layer 105. A HHMT of 2DHG or other structure can be formed on the left and a HEMT of 2 DEG or other structure can be formed on the right. As is known to persons skilled in the art, these changes are all within the scope of the present disclosure.

In some embodiments, it is more advantageous to implement a HEMT or a HHMT that includes only 2 DEG or 2DHG. In general, in order to realize such structure, it is possible to make the step-shape structure formed by substrate 101 and shielding layer 103 high enough, then make the nucleation layer 104, buffer layer 105, channel layer 106, channel provide layer 107 grown. For example, in the structure shown in FIG. 1, removing 2DHG will prevent 2DHG from responding to potential changes at respective electrodes, make no increase in parasitic capacitance and leakage channels and reduce leakage current of the HEMT. Therefore, the HEMT 100 with the structure described in FIG. 1 has better working stability.

In some embodiments, the material of isolation layer 102, the shielding layer 103, gate insulation layer 109 and outer insulation layer 119 may be formed from at least one kind of insulating material such as silicon oxide, silicon nitride oxide or silicon nitride, and may also have a single-layer or multi-layer structure.

As shown in some embodiments of the present disclosure, a HEMT comprising a 2 DEG formation in the vertical direction has a number of excellent properties. First of all, the voltage withstanding capacity of HEMT is greatly improved. Even using Si substrates with lower cost and more mature technology, the voltage withstanding capacity of HEMTs is close to that of HEMTs on intrinsic GaN substrates. Secondly, the contact area between the vertical channel device and the substrate of the disclosure is comparably small, and the influence of the substrate is kept small, which is easy to overcome the problems such as the epitaxial layer cracking of the traditional planar device. Furthermore, by increasing arrangement density of the vertical channels, the conductive area of the device can be increased, and the substrate area can be used more adequately.

It should be appreciated the above description is only an illustrative embodiment of the structure of the HEMT. The HEMT also have a variety of other structures or modifications, changes, or variants on these structures to provide different properties or functions. These structures and their improvement, alteration or variation may also be applied to the scheme of the disclosure under the technical conception of the disclosure.

Figure 2A:
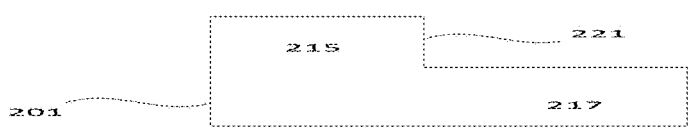
FIGS. 2A-2P are schematic flow charts of a method of manufacturing a HEMT according to an embodiment of the present disclosure.

The disclosure also provides a manufacturing method for a HEMT. FIG. 2A-FIG. 2P are flow charts of a method of manufacturing a HEMT according to an embodiment of the present disclosure. In this embodiment, the device manufactured on an Si substrate is taken as an example. Similar structures can be achieved with other substrates such as intrinsic GaN, $Al_2O_3$ (sapphire), SiC, etc., as understood by persons skilled in the art.

As shown in the figures, HEMT manufacturing method 200 comprises, in step 210, forming a vertical interface 221 on the substrate 201 as shown in FIG. 2A. Thus, a first area 215 and a second area 217 of different height are formed on the substrate 201. The vertical interface 221 is between the first area 215 and the second area 217.

Figure 2B:
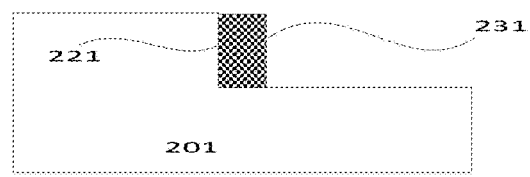

In step 220, a protective layer is formed, e.g., grown, on the substrate to cover the vertical surface 221, as shown in FIG. 2B. In some embodiments, SiN is grown on substrate 201 using techniques such as LPCVD to cover substrate 201. Then, through vertically oriented etching technique, only SiN at the vertical interface 221 is retained, forming the protective layer 231. The protective layer 231 covers the vertical interface of the substrate.

Figure 2C:
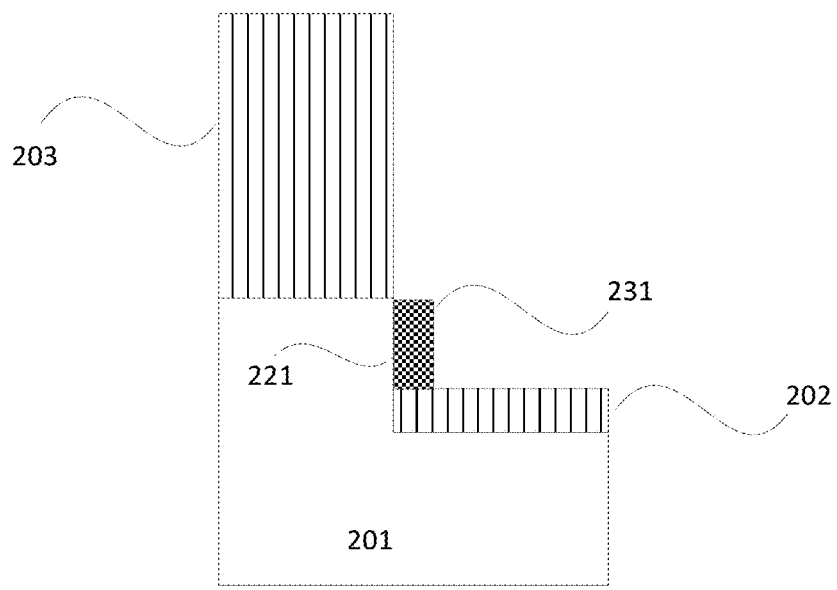

In step 230, an isolation layer 202 and a shielding layer 203 are formed above the substrate 201, as shown in FIG. 2C. The substrate is covered with an isolation layer 202 and a shielding layer 203. In some embodiments, $SiO_2$ can be grown by oxidation techniques to form an insulating layer over the substrate 201. Since the vertical interface 221 of substrate 201 is covered with a protective layer 231, the vertical interface 221 of substrate 201 has virtually no isolation layer 202 and shielding layer 203 growing on it. The insulation layer above the first area 215 is then covered with a mask, and the insulation layer on the second area 217 is partially etched by photolithography to reduce the height of the insulation layer on the second area 217, while ensuring that the insulation layer is still covered on the second area 217. This results in a higher isolation layer 202 and a lower shielding layer 203 on the substrate 201. Persons skilled in the art should understand that other methods of forming isolation and shielding layers can also be applied here.

Figure 2D:
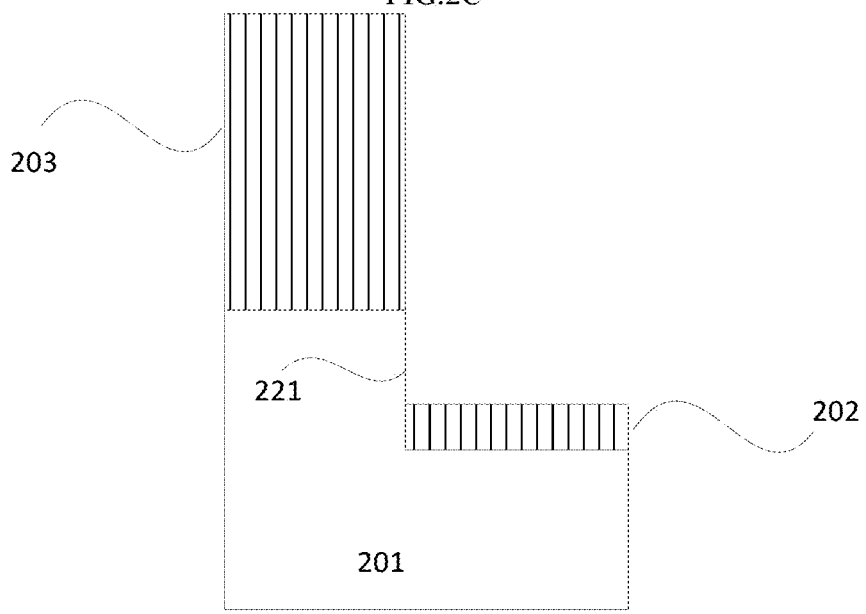

In Step 240, the protective layer is removed as shown in FIG. 2D. In some embodiments, SiN on the vertical interface 221 was removed by selective etching, therefore exposing the vertical interface 221 on substrate 201, while retaining the isolation layer 202 and the shielding layer 203 on substrate 201.

There are other techniques to form isolation and shielding layers on the substrate and expose the vertical interface of the substrate, which are all included in the scope of the disclosure. For example, an insulating layer can be formed, e.g., grown, on horizontal substrates. Then, a portion of the insulating layer is covered with a mask, and the insulating layer and substrate are etched by photolithography so that the first area 215 and the second area 217 of the substrate is formed, wherein area 215 is covered by the insulating layer and the second area 217 and the vertical interface 221 are exposed. A protective layer is then formed over all exposed surfaces. The protective layer on the second area 217 is then etched in an anisotropic etching manner and the protective layer on the vertical interface 221 is retained. Another insulating layer is then formed on the surface of the second area 217, and then selectively etched the protective layer. This will expose the vertical interface 221 with the first area 215 and the second area 217 covered by the insulating layer respectively.

Figure 2E:
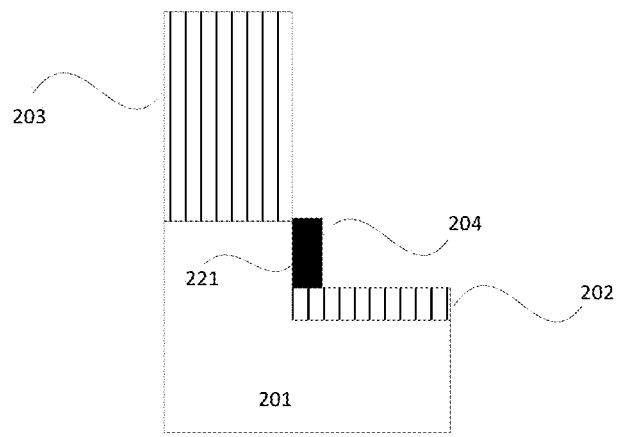

In Step 250, a nucleation layer 204 is formed on the exposed vertical surface 221 of the substrate 201, as shown in FIG. 2E. For the Si substrate, AlN is used in the nucleation layer 204 due to the melt-back effect of Ga atoms. As is known to persons skilled in the art, GaN can be directly nucleated at $Al_2O_3$ (sapphire), SiC or intrinsic GaN, but crystal quality control is difficult. Therefore, the nucleation layer 204 is introduced in general processes. In some cases, the nucleation layer 204 in step 205 may not be necessary to introduce such as low temperature GaN.

The capacity of selective regional growth of AlN is weak. As a result, there may be some growth in the isolation layer 202 and the shielding layer 203, which will have an adverse effect on the semiconductor devices. In some embodiments, the wafer can be taken out after AlN is grown. The AlN nucleation layer on the vertical surface can be retained by etching with anisotropy, while the AlN in other places can be removed, for example, by dry etching using vertical downward ion bombardment. Since the AlN on the vertical surface is less bombarded by ions and the AlN on other surfaces is more bombarded, only AlN on the vertical surface preserved can be achieved.

In some embodiments, the desire to remove AlN from the isolation layer 202 and shielding layer 203 may also lead to the introduction of corrosive gases, such as chlorine or chlorinated gas, during the formation of the nucleation layer. Due to the amorphous or polycrystalline structure of isolation layer 202 and shielding layer 203, AlN is more difficult to nucleate at isolation layer 202 and shielding layer 203 in a chlorine atmosphere. In addition, even if AlN attachment appears in the isolation layer 202 and the shielding layer 203, the AlN attached to the isolation layer 202 and the shielding layer 203 are also amorphous or polycrystalline, and chlorine gas has a strong corrosive effect on them, and the AlN attached will be etched away by chlorine gas. The AlN of the nucleation layer is a single crystal structure, which is weakly corroded by chlorine. The AlN of the nucleation layer can grow well under the chlorine atmosphere. Therefore, this method can also realize the selective growth of the nucleated layer.

Figure 2F:
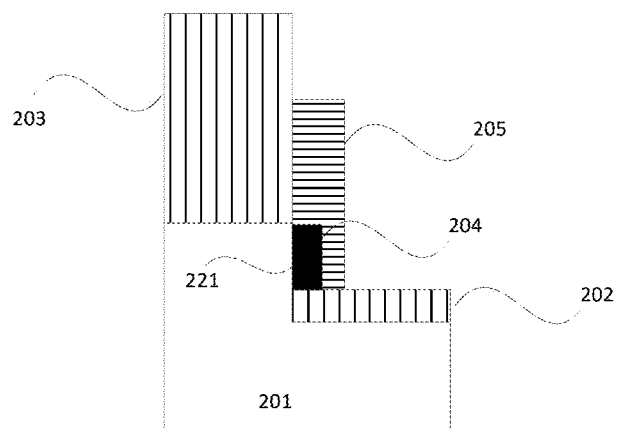

In Step 260, a buffer layer is formed on the nucleation layer, as shown in FIG. 2F. The buffer layer 205 is formed by epitaxial growth on nucleation layer 204. As mentioned in the above, the buffer layer is not necessary in the structure of some semiconductor devices of the present disclosure. In essence, the buffer layer and the channel layer are very similar in nature and can even be the same material. In other words, the basic structure is the channel layer/channel supply layer, and there can be a buffer layer between the channel layer and the nucleation layer.

Figure 2G:
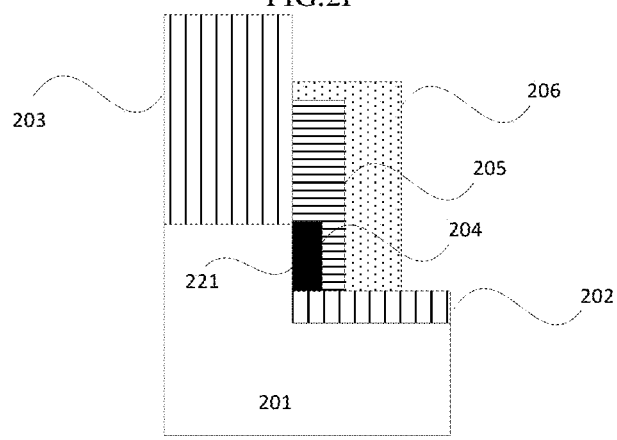
Figure 2H:
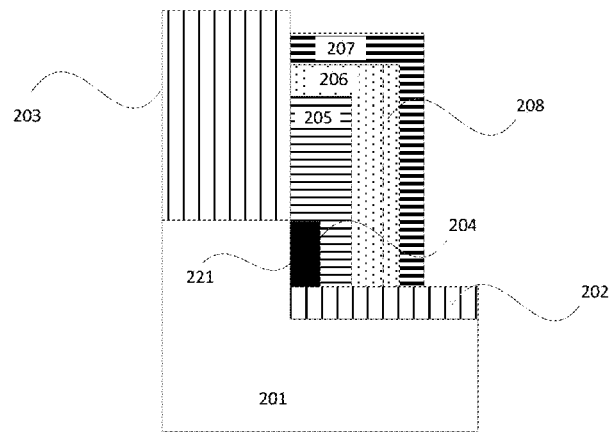

In Step 270, a channel layer is formed on the buffer layer, as shown in FIG. 2G. The channel layer 206 is formed by epitaxial growth on buffer layer 205. In Step 280, a channel supply layer is formed on the channel layer, as shown in FIG. 2H. The channel supply layer 207 is formed by epitaxial growth on the channel layer 206.

Channels are generated at the interface of nitride semiconductor with narrow/wide band gap width. They are located in the channel layer with low band gap width and near the interface of channel layer/channel supply layer. The most common example is the GaN/AlGaN interface. The channel can accommodate 2 DEG. Electrons flow mainly in the channel and have high mobility and charge density.

Figure 2I:
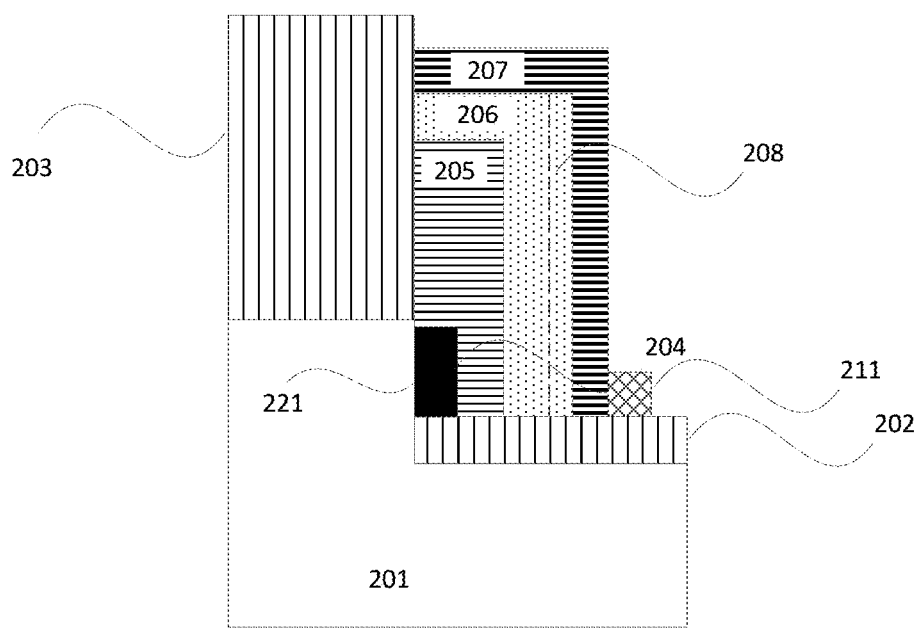

In step 290, the first electrode 211 is formed on the insulation layer 202, as shown in FIG. 2I. In some embodiments, the channel supply layer 207 and part of the channel layer 206 which is defined as drain area may be etched and the first electrode 211 may then be formed in the exposed area. Electrode deposition methods may be used, such as electron beam evaporation physical deposition or electrochemical deposition methods. The first electrode 211 is in ohmic contact with channel layer 206 and can be electrically connected with 2 DEG. In some embodiments, partial etching may not be required. The first electrode 211 is formed on the part of the channel supply layer 207 that defines the drain area. The first electrode 211 is in ohmic contact with the channel supply layer 207 and can also be electrically connected with 2 DEG.

Usually the first electrode material is metal. In some embodiments, in addition to the deposition at the bottom, a small amount of deposition on the side may occur during the deposition of the first electrode. The undesired deposition of the metal layer on the side wall may be removed by isotropic etching.

Figure 2J:
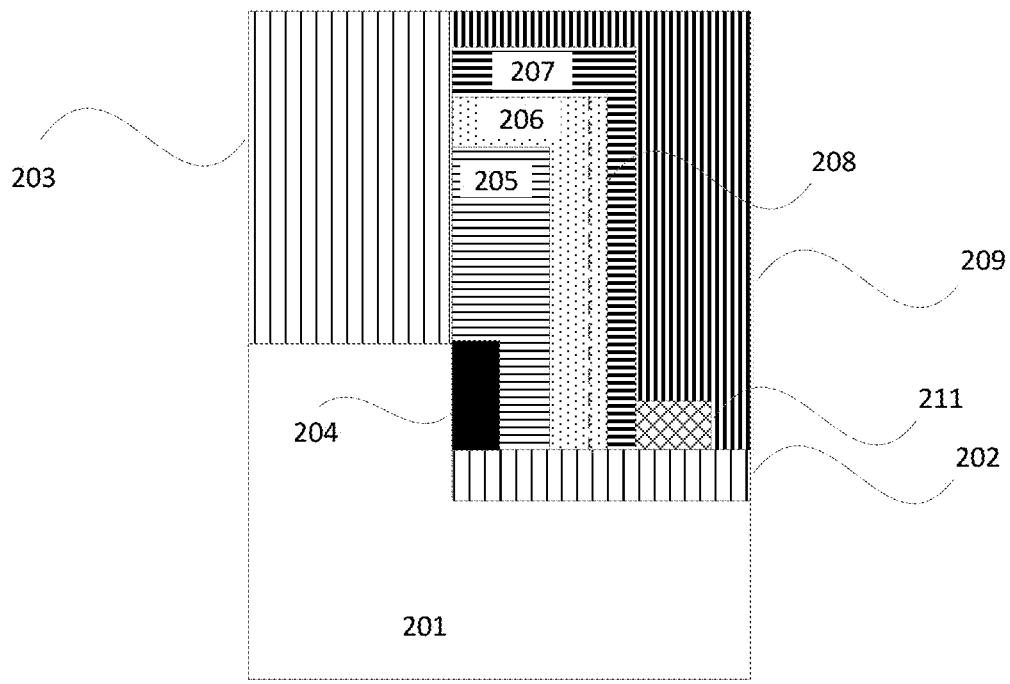

In step 2100, a passivation layer 209 is formed, covering the channel supply layer 207 and first electrode 211, as shown in FIG. 2J. Besides the channel supply layer 207, the insulating layer 209 can be formed on the channel supply layer 207 by means of material deposition, such as, the $SiO_2$ growing by CVD technology.

Figure 2K:
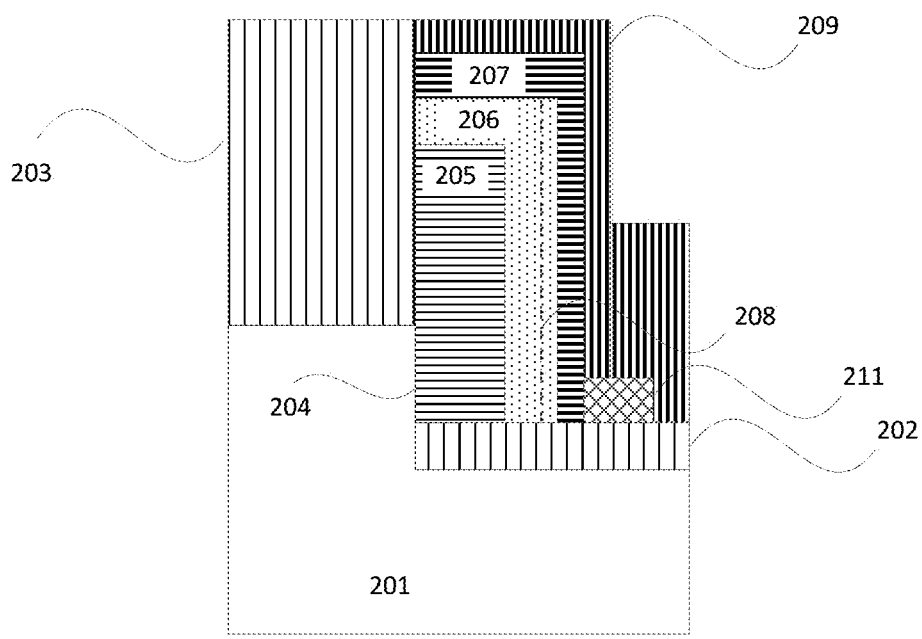

In Step 2110, the passivation layer 209 above the gate electrode area is removed as shown in FIG. 2K. In some embodiments, the passivation layer above the gate electrode area location can be completely removed, exposing the channel supply layer 207 above the gate electrode area. In other embodiments, a part of the passivation layer may be retained without exposing the channel supply layer 207. After the formation of the gate electrode, the passivated layer between the channel supply layer 207 and the gate electrode becomes a gate insulation layer.

Figure 2L:
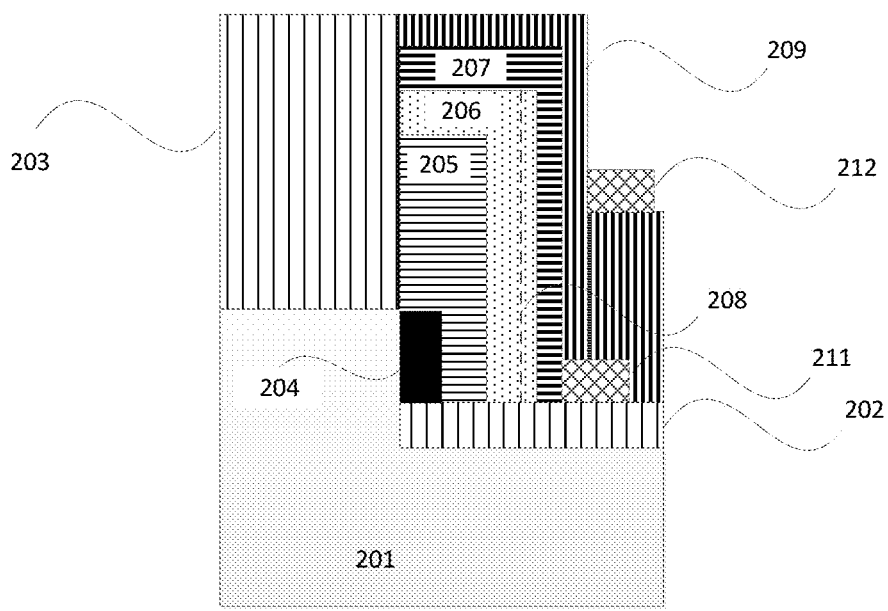

In Step 2120, a third electrode 212 is formed on the passivation layer 209, as shown in FIG. 2L. The third electrode 212 is provided as a gate outside of the channel supply layer 207. A schottky contact is formed between the third electrode 212 and the gate insulating layer or channel supply layer 207. A third electrode may be formed by, such as, the electron beam evaporation physical deposition or by electrochemical method.

The third electrode material is usually metal. In some embodiments, in addition to the deposition at the bottom, there may be a small amount of deposition on the side during the deposition of the third electrode. The undesired metal layer deposition on the side wall may be removed by the isotropic corrosion.

Figure 2M:
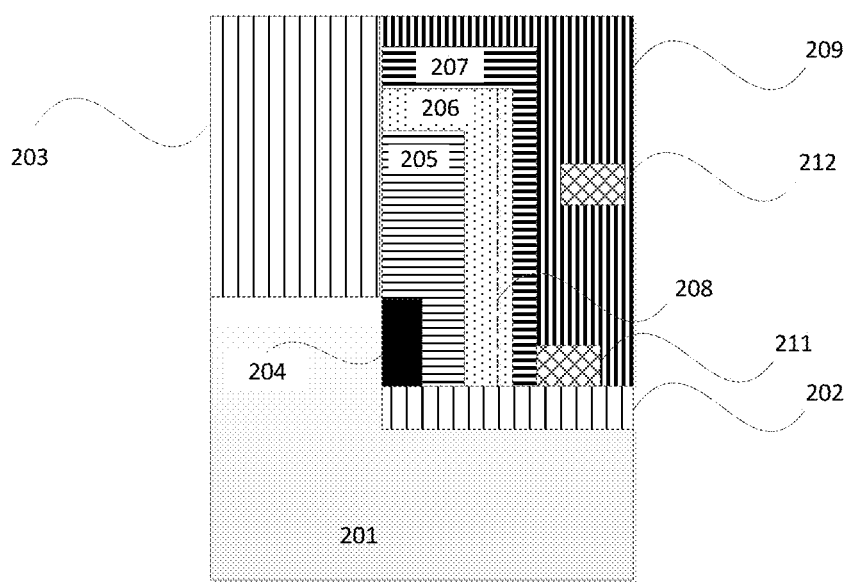

In Step 2130, a passivated layer 209 is formed, covering the third electrode, as shown in FIG. 2M. In some embodiments, the passivated layer 209 can be formed by CVD deposition, such as $SiO_2$ growing by CVD deposition, covering the third electrode.

Figure 2N:
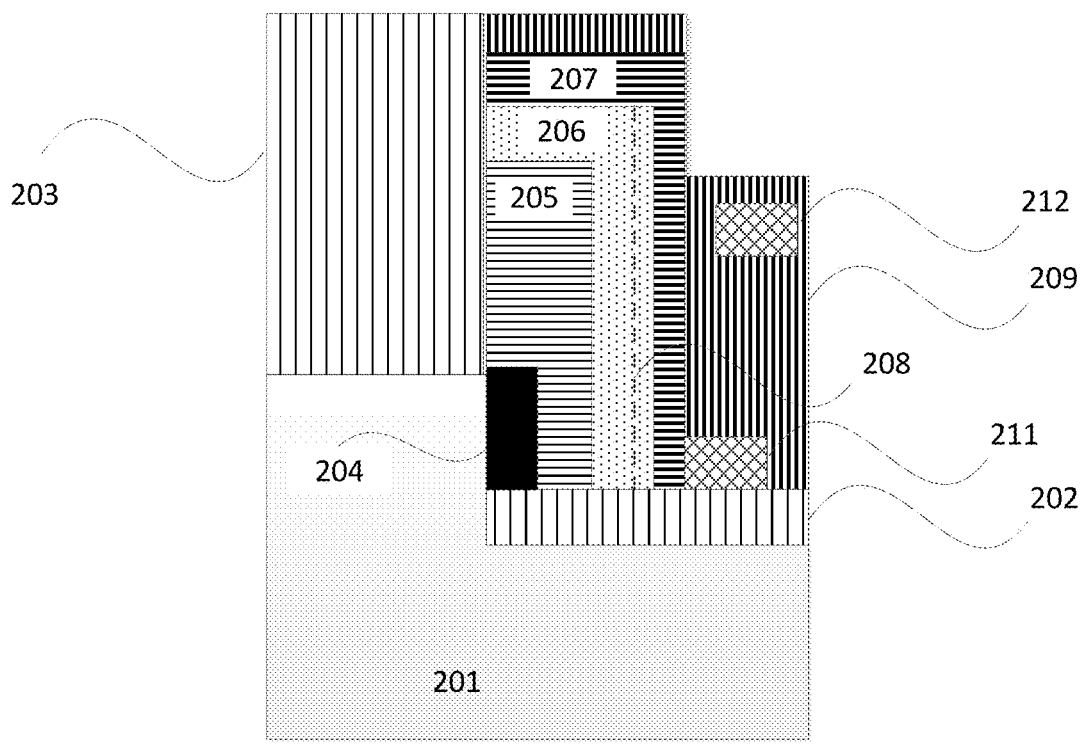

In Step 2140, the passivation layer 209 above the location of the first electrode area is removed, as shown in FIG. 2N. Similar to Step 2110, the selective etching is used to exposes the passivation layer above the location of the first electrode area, while retaining a part of the insulation layer outside of the channel supply layer.

Figure 2O:
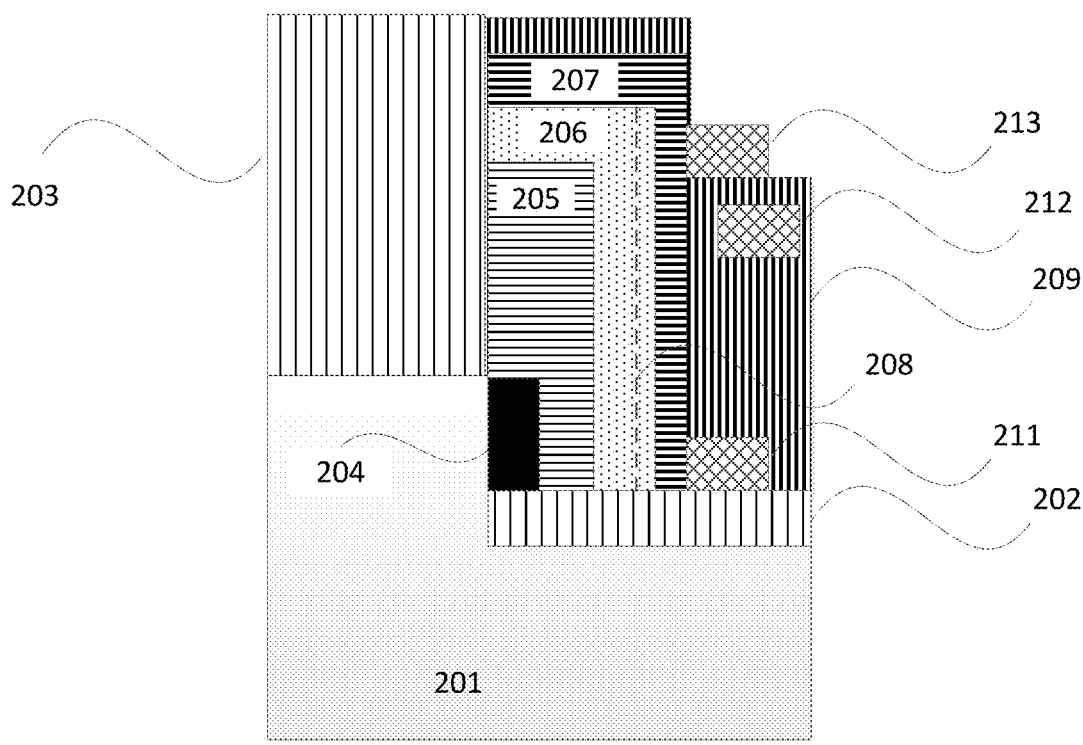
Figure 2P:
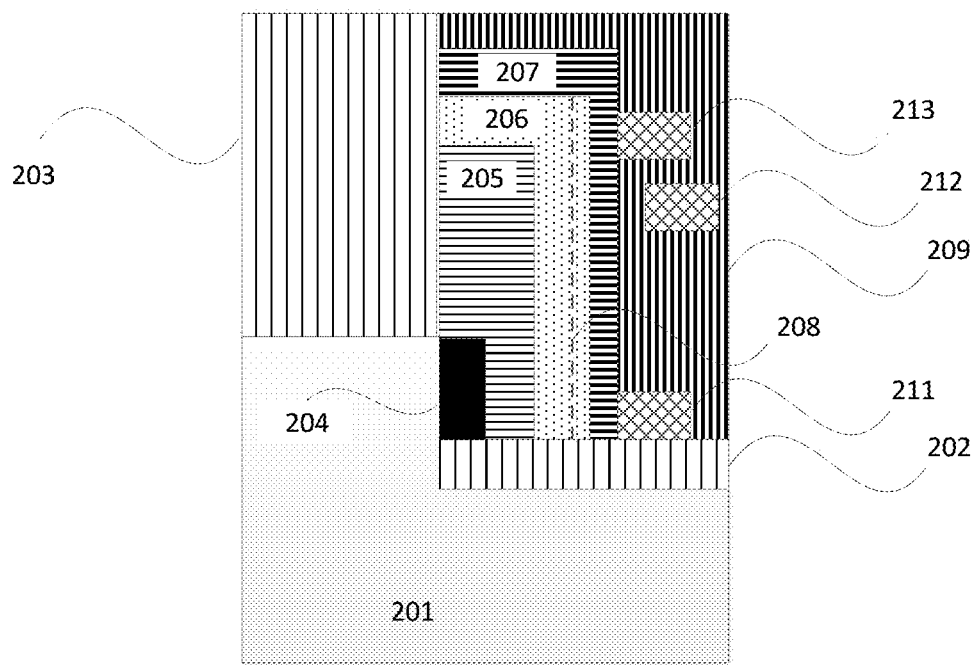

In Step 2150, a second electrode 213 is formed on the passivation layer 209, as shown in FIG. 2O. Similar to Step 290, the passivation layer 209 and the channel supply layer 207 or a part of the channel layer 206 at the position corresponding to the source electrode are etched, and the second electrode 213 can be formed outside of the exposed channel layer 206. Electrode formation methods, such as electron beam evaporation physical deposition or electrochemical methods, may be used. The second electrode 213 has ohmic contact with channel 206 and can form an electrical connection with 2 DEG.

The second electrode material is usually metal. In some embodiments, in addition to the deposition at the bottom, there may be a small amount of deposition on the side during the deposition of the second electrode. The undesired deposition on the side wall may be removed by the isotropic corrosion.

In step 2160, a passivation layer 209 is formed and the second electrode 213 is coated, as shown in FIG. 2P. In some embodiments, the passivated layer 209 may be formed by CVD deposition, such as, $SiO_2$ growing by CVD deposition.

In some embodiments, when an insulating layer is formed over a channel supply layer, it may be formed in-situ in the same growth device after the epitaxial growth of a nitride semiconductor, such as, the SiN insulating layer may be grown in situ. Alternatively, the growing may be done after the wafer is taken out.

Figure 3:
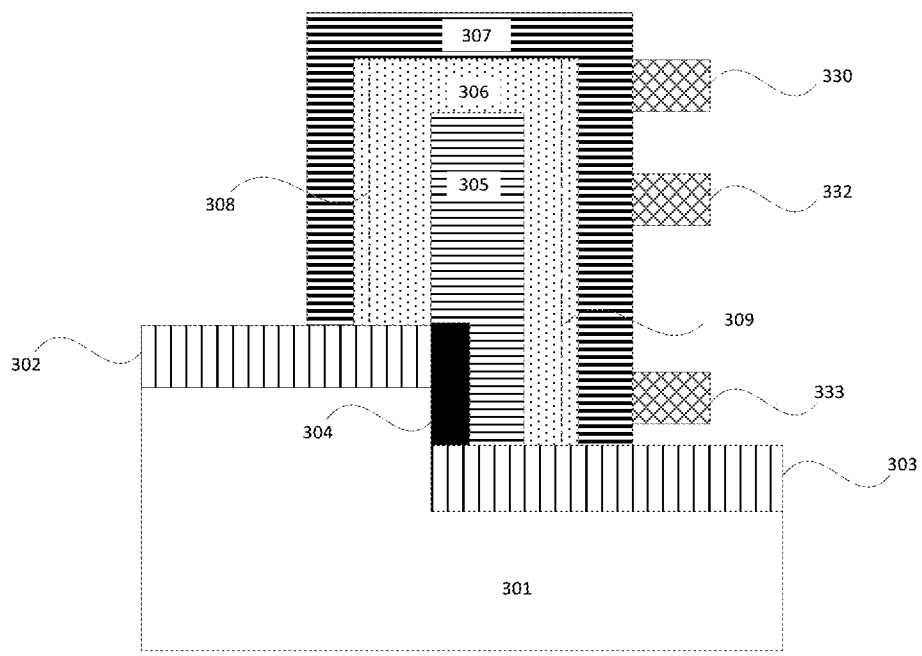
FIG. 3 is a schematic diagram of a HEMT with silicon substrate according to an embodiment of the present disclosure.

FIG. 3 is a schematic diagram of a HEMT with silicon substrate according to an embodiment of the present disclosure. In the embodiment in FIG. 3, a 2DHG is also formed on the other side of the channel layer. As shown, the HEMT 300 includes a substrate 301, a nucleation layer 304, a buffer layer 305, a channel layer 306, a channel supply layer 307, an insulation layer 302, and a spacing layer 303, etc. The first electrode 333 and the second electrode 330 in ohmic contact with 2 DEG 309 which is formed on the one side of channel supply layer 307. The third electrode 332 is formed on the channel supply layer 307 and is in Schottky contact with channel supply layer 307. The structures similar to the HEMT shown in FIG. 1 will not be repeated here. In the embodiment shown in FIG. 3, 2DHG 308 is formed on the left of channel layer 306. However, compared with the structure in FIG. 1, the preparation process of the structure shown in FIG. 3 may be simpler.

Figure 4:
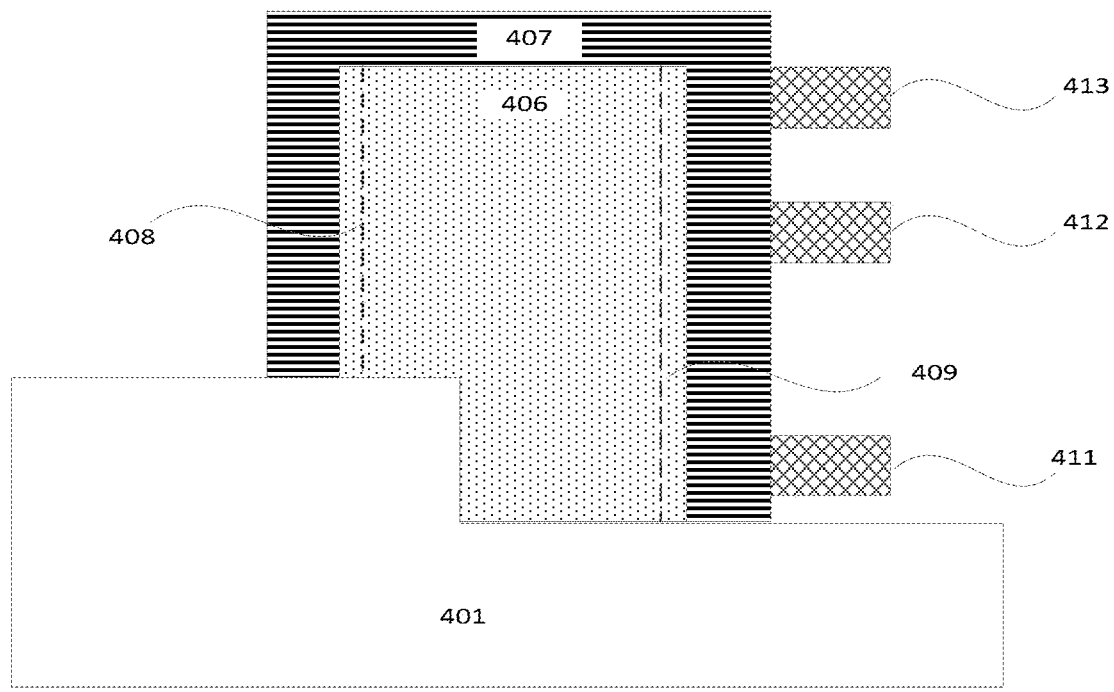
FIG. 4 is a schematic diagram of a HEMT with non-silicon substrate according to an embodiment of the present disclosure.

FIG. 4 is a schematic diagram of a HEMT with non-silicon substrate according to an embodiment of the present disclosure. In the embodiment shown in FIG. 4, the substrate may be GaN intrinsic substrate. The structure and process are relatively simple.

As shown in the figure, the HEMT 400 includes a substrate 401 and a vertical interface formed on the substrate 401, resulting in a step-shape substrate structure. The HEMT 400 comprises a channel layer 406 and a channel supply layer 407. The channel layer 406 is outside of the vertical interface of substrate 401. The channel supply layer 407 is formed outside of the channel layer 406 and covers the channel layer 406. Within the channel layer 406, 2 DEG 409 and 2DHG 408 are formed near the interface of the channel supply layer 407. The first electrode 411 and the second electrode 413 in ohmic contact with the 2 DEG are formed on the channel supply layer 407, and the third electrode 412 is formed on the channel supply layer 407 and is in Schottky contact with the channel supply layer 407. In some other embodiments, the substrate material may also be SiC or sapphire $Al_2O_3$.

Figure 5A:
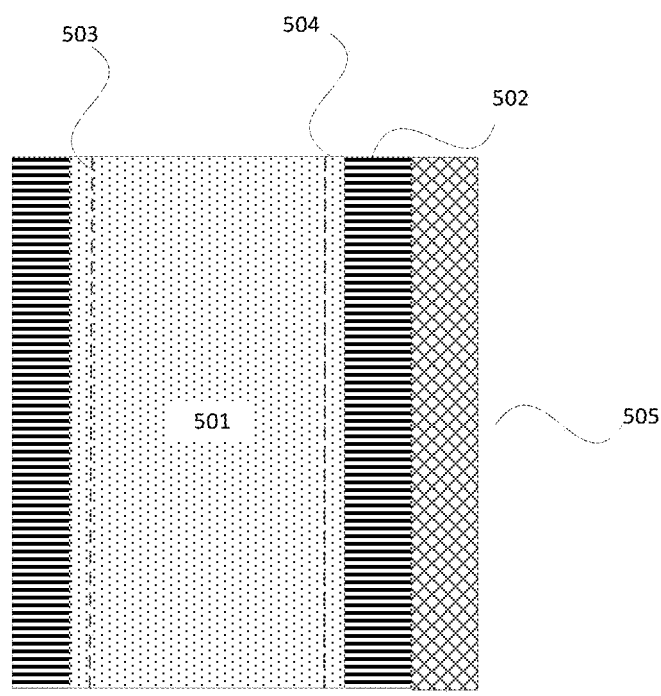
FIG. 5A is a top view of a vertical configuration of the electrodes of a HEMT with non-silicon substrate according to an embodiment of the present disclosure.
Figure 5B:
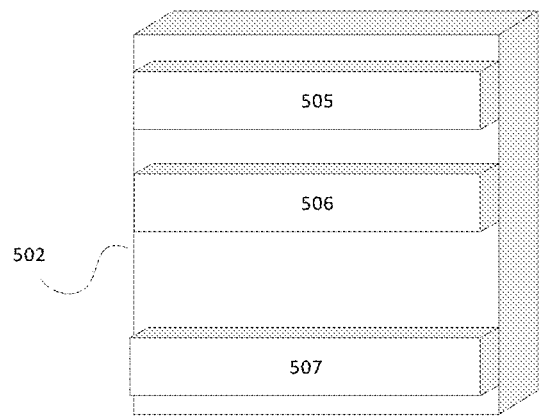
FIG. 5B is a stereo view of a vertical configuration of the electrodes of a HEMT with non-silicon substrate according to an embodiment of the present disclosure.

The different arrangements of the three HEMT electrodes are shown in embodiments of FIGS. 5A-5B and FIGS. 6A-6B. FIG. 5A is a top view of a vertical configuration of the electrodes of a HEMT with non-silicon substrate according to an embodiment of the present disclosure; FIG. 5B is a stereo view of a vertical configuration of the electrodes of a HEMT with non-silicon substrate according to an embodiment of the present disclosure. As shown in the figures, HEMT 500 includes: a channel layer 501, a channel supply layer 502, a 2DHG 503, a 2 DEG 504, a first electrode 505, a second electrode 506 and a third electrode 507. As shown in FIG. 5B, the first electrode 505, the second electrode 506 and the third electrode 507 are arranged vertically, while only the second electrode 506 can be seen in FIG. 5A. This arrangement is advantageous to reduce the chip area occupied.

Figure 6A:
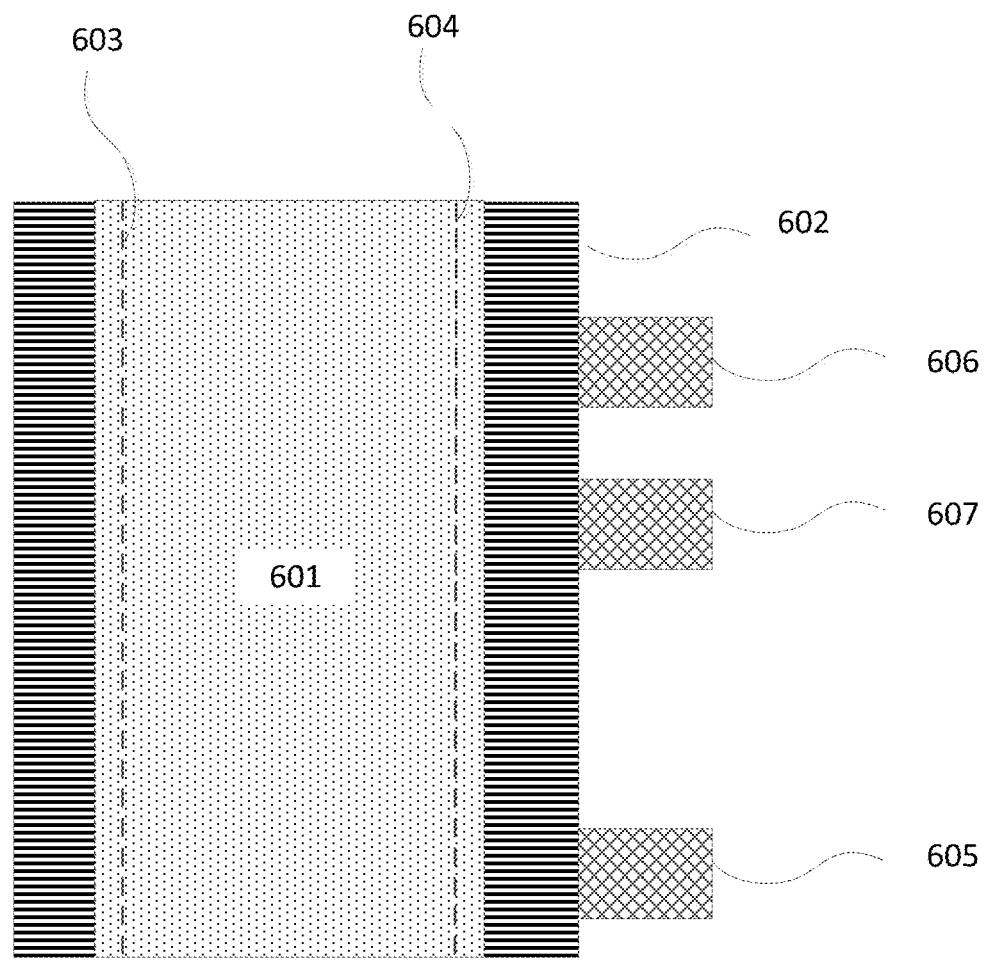
FIG. 6A is a top view of a level configuration or a slant configuraton of the electrodes of a HEMT with non-silicon substrate according to an embodiment of the present disclosure.
Figure 6B:
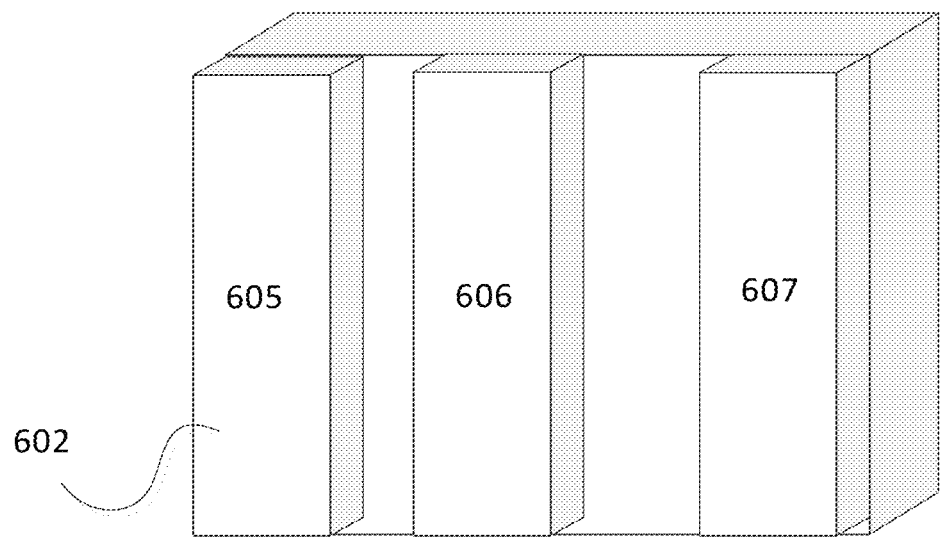
FIG. 6B is a stereo view of a level configuration of the electrodes.

FIG. 6A is a top view of a level configuration and FIG. 6B is a stereo view of configuration of the electrodes of a HEMT with non-silicon substrate according to an embodiment of the present disclosure.

As shown in the figures, the HEMT 600 includes a channel layer 601, a channel supply layer 602, a 2DHG 603, a 2 DEG 604, a first electrode 605, a second electrode 606, and a third electrode 607. In combination with the structure shown in FIG. 4, the embodiments in FIG. 6A and FIG. 6B show that the first electrode 605, the second electrode 606 and the third electrode 607 are arranged laterally and have the same horizontal height.

To the knowledge of persons skilled in the art, the above description is only an illustrative embodiment of the structure of HEMT. The HEMT also have a variety of other structures or modifications, changes, or variants on these structures to provide different properties or functions. These structures and their improvement, alteration or variation may also be applied to the scheme of the disclosure under the technical conception of the disclosure.

Figure 7A:
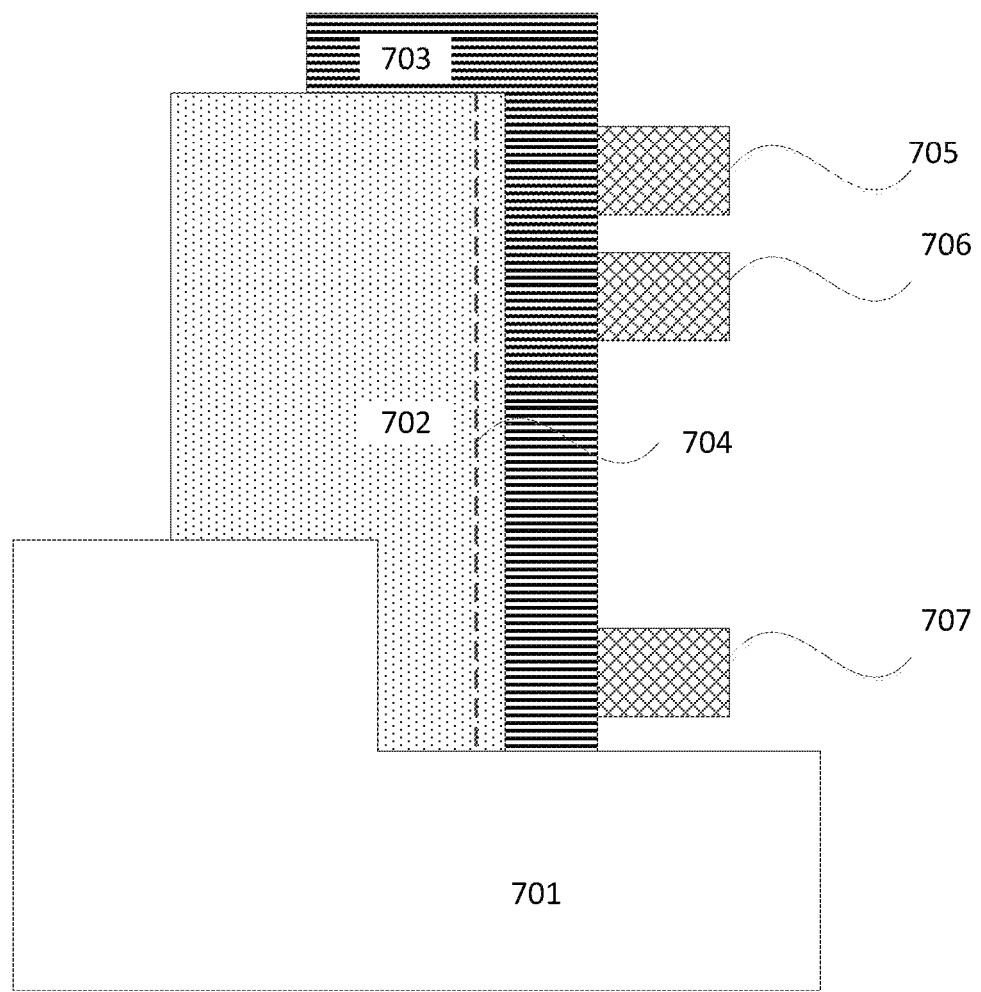
FIG. 7A is a schematic view of a HEMT without 2DHG according to an embodiment of the present disclosure.
Figure 7B:
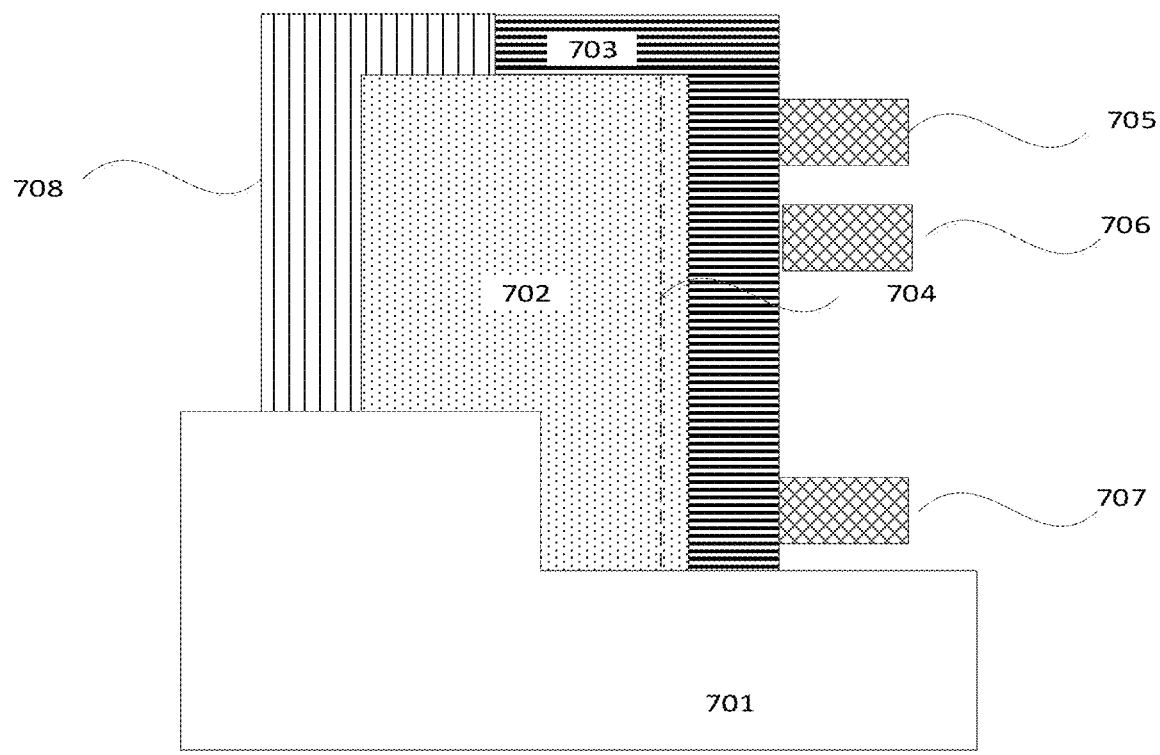
FIG. 7B is a schematic view of a HEMT without 2DHG according to another embodiment of the present disclosure.
Figure 7C:
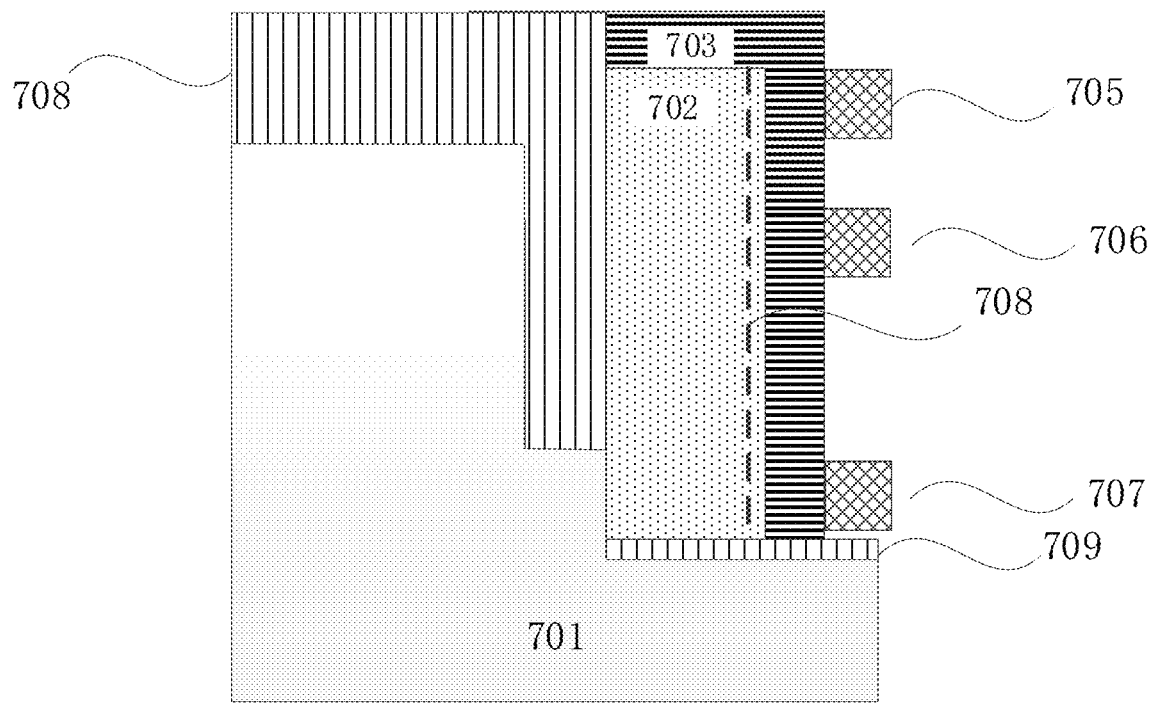
FIG. 7C is a schematic view of a HEMT without 2DHG according to another embodiment of the present disclosure.

FIGS. 7A-7C shows other structures of the one-side HEMT. FIG. 7A is a schematic diagram of a HEMT without 2DHG according to an embodiment of the present disclosure. Like the structure of the FIG. 4 embodiment, the HEMT 700 comprises a substrate 701, a channel layer 702, and a channel supply layer 703. As shown, after the growth of channel supply layer 703 outside of the channel layer 702, the channel supply layer 703 in the left part is removed. Thus, only 2 DEG 704 exists on the right side, resulting in a HEMT of 2 DEG on one side. In some embodiments, the top surface of the channel layer 702 may retain a part of the channel supply layer. In some embodiments an insulating layer 707 may be introduced to cover the channel layer 702.

FIG. 7B is a schematic diagram of a HEMT without 2DHG according to an embodiment of the present disclosure. Like the structure of the FIG. 4 embodiment, the HEMT 720 comprises a substrate 701, a channel layer 702, and a channel supply layer 703. As shown, after the channel layer 702 is grown, the insulation layer 708 is grown, and then the insulation layer 708 on the right side of channel layer 702 is etched, and the channel supply layer 703 is then grown. That is, after the channel layer is generated, an insulating layer is used to protect the channel layer, and the channel supply layer is grown after that. Thus, only 2 DEG 704 exists on the right side, resulting in a HEMT of 2 DEG on one side.

FIG. 7C is a schematic diagram of a HEMT without 2DHG according to an embodiment of the present disclosure. Like the structure of the embodiment in FIG. 4, the HEMT 720 comprises a substrate 701, an isolation layer 702, a shielding layer 703, a channel layer 706, a channel supply layer 707, a first electrode 711, a second electrode 713, and a third electrode 712.

As shown, a high step structure is formed on the substrate before the channel layer 706 grows, such as the growth of an isolation layer 702. Then, the isolation layer 702 on the right is etched off for growing of the channel layer 706 and the channel supply layer 707. Then, a protective layer and a shielding layer are grown respectively, and the protective layer is etched to expose the vertical interface of the substrate. The channel layer 706 and channel supply layer 707 were provided on the right side. Thus, only 2 DEG 708 exists on the right side, resulting in a HEMT of 2 DEG on one side. Similarly, if the left insulation layer 707 is etched and then the left channel layer 706 and channel supply layer 703 are grown, a single-side 2 DEG HEMT can also obtained.

Figure 7D:
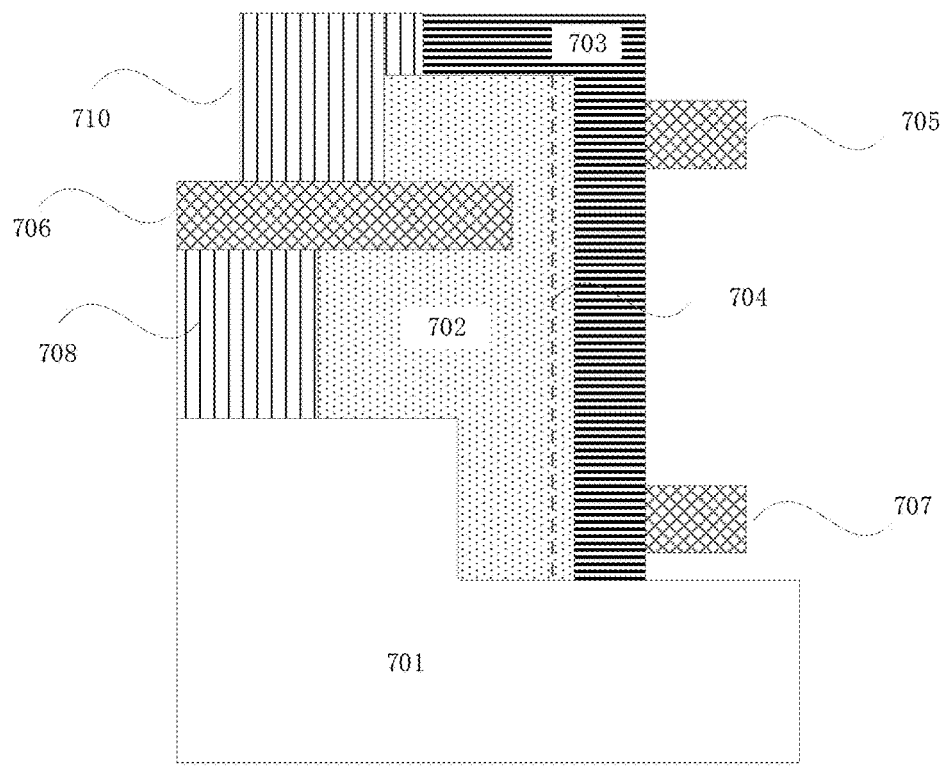
FIG. 7D is a schematic view of a HEMT without 2DHG according to another embodiment of the present disclosure.

FIG. 7D is a schematic diagram of a HEMT without 2DHG according to an embodiment of the present disclosure. Like the structure of the embodiment in FIG. 4, the HEMT 720 comprises a substrate 701, an isolation layer 702, a shielding layer 703, a channel layer 706, a channel supply layer 707, a first electrode 711, a second electrode 713, and a third electrode 712.

As shown, after the channel layer 706 grown reaches a certain height, a third electrode 706 is formed above the channel layer, but part of the channel layer 706 is still exposed. Then, the channel layer 706 continues to grow on exposed channel layer 706, covering part of the third electrode 712. The channel supply layer 707 is grown, but only the right channel was reserved to obtain one-side 2 DEG 704. A shielding layer 702 is formed on the left side of channel layer 706 and channel supply layer 707, resulting in a HEMT with a third electrode 712 on the left and a first electrode and a third electrode on the right.

Figure 8:
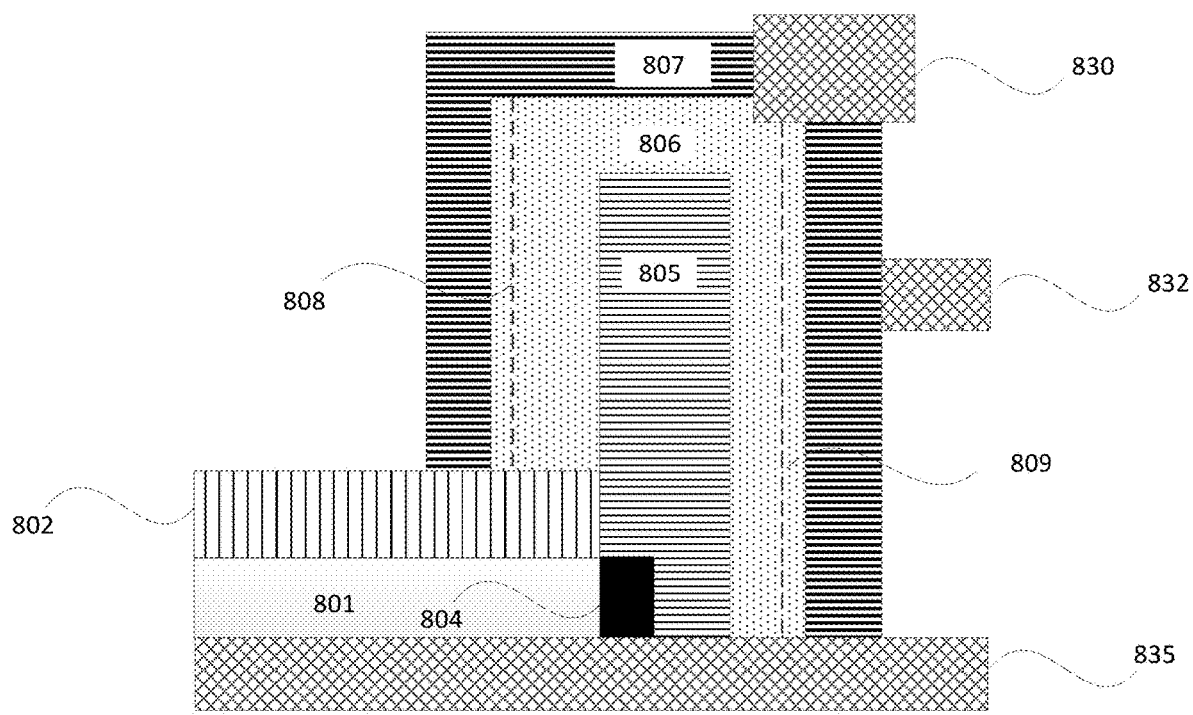
FIG. 8 is a schematic view of a HEMT according to another embodiment of the present disclosure.

FIG. 8 is a schematic diagram of an embodiment of the present disclosure, HEMT. As shown in the Fig, HEMT 800 includes: a nucleation layer 804, a buffer layer 805, a channel layer 806, a channel supply layer 807, a 2DHG 808, a 2 DEG 809, a first electrode 835, a second electrode 830 and a third electrode 832. Unlike the structure of other embodiments, the first electrode 835 extends under the channel layer 806 and the channel supply layer 807. In some embodiments, the first electrode 835 is disposed on a substrate. After completing preparation of the structure above the first electrode 835, the substrate below may still remain. In some embodiments, the substrate under the first electrode 835 may be partially or completely removed. In this way, the first electrode 835 can be lined out from below to realize electrical connection. The second electrode 830 and the third electrode 832 are still lined out from the top to realize electrical connection. In comparison with the structures in which all electrodes are electrically connected from the top, the high voltage of the first electrode requires a large insulation distance, which is adverse for reducing the size of the device; while in the structure shown in FIG. 8, the second electrode and the third electrode with low potential are lined out from the top of the device, and the first electrode is lined out from the bottom of the device, which can effectively save space, reduce parasitic capacitance inductance, and also facilitate subsequent device packaging. Furthermore, the structure shown in FIG. 8 reduces the thermal resistance of the device by removing the silicon substrate. The heat can be effectively derived from both sides, especially the first electrode which can be directly connected to the thermal conductivity device, which can greatly reduce the thermal resistance.

In preparing the HEMT shown in FIG. 8, the second and third electrodes can be formed first. After removing most or all of the silicon substrate to expose 2 DEG 809, the first electrode 835 is then formed. In some embodiments, it is preferable to add a support structure to the wafer prior to the removal of the silicon substrate because the mechanical strength of the wafer is significantly reduced after substrate removal.

In some embodiments, the second electrode 830 extends laterally along top of the channel layer 806 and/or the channel supply layer 807. The second electrode is placed above the device to facilitate the electrical connection in the later stage, and also facilitates the isolation between the electrodes, improving the withstand voltage and reducing the dark current.

The above-described embodiments are merely illustrative of the present disclosure, and are not intended to limit the present disclosure. Various changes and modifications may also be made by those skilled in the art without departing from the scope of the present disclosure. Therefore, all the equivalent technical solutions should also fall within the scope of the present disclosure.

What is claimed is:

1. A high electron mobility transistor (HEMT), comprising:
   a vertical interface which is substantially perpendicular to a substrate surface;
   a channel layer disposed outside of the vertical interface;
   a channel supply layer disposed outside of the channel layer, wherein a vertical two-dimensional electron gas (2DEG) is formed in the channel layer adjacent to an interface between the channel layer and the channel supply layer;
   a first electrode configured to be electrically connected to the vertical two-dimensional electron gas (2DEG);
   a second electrode configured to be electrically connected to the vertical two-dimensional electron gas (2DEG); and
   a gate electrode disposed outside the channel supply layer;
   wherein the vertical interface is a (111) plane of Si, a (0001) plane of $Al_2O_3$, a (0001) plane or a (000-1) plane of SiC, or a (0001) plane of GaN intrinsic substrate;
   wherein the substrate includes a first area and a second area, the first area is higher than the second area, the vertical two-dimensional electron gas (2DEG) is formed above the second area, and the vertical two-dimensional electron gas (2DEG) has a larger height than the vertical interface.

2. The high electron mobility transistor according to claim 1, wherein the first electrode or the second electrode form an ohmic contact with the channel supply layer.

3. The high electron mobility transistor according to claim 1, wherein the first electrode, the second electrode, and the gate electrode are at a same side of the two-dimensional electron gas (2DEG).

4. The high electron mobility transistor according to claim 3, wherein the first electrode, the second electrode, and the gate electrode are in a same level or in a same upright position.

5. The high electron mobility transistor according to claim 1, wherein the first electrode and the second electrode are at a different side of the two-dimensional electron gas (2DEG) with the gate electrode.

6. The high electron mobility transistor according to claim 1, wherein the first electrode extends under the channel layer.

7. The high electron mobility transistor according to claim 6, wherein the first electrode is a drain electrode.

8. The high electron mobility transistor according to claim 1, wherein the second electrode extends on the channel layer.

9. The high electron mobility transistor according to claim 8, wherein the second electrode is a source electrode.

10. The high electron mobility transistor according to claim 1, further comprising a nucleation layer on the vertical interface of the substrate.

11. The high electron mobility transistor according to claim 10, further comprising a buffer layer located between the nucleation layer and the channel layer.

12. The high electron mobility transistor according to claim 1, further comprising a shielding layer formed on a side of the channel layer nonadjacent to the two-dimensional electron gas (2DEG).

13. The high electron mobility transistor according to claim 1, further comprising an insulating layer extending under the channel layer and the channel supply layer.

14. The high electron mobility transistor according to claim 1, further comprising a gate insulating layer between the channel supply layer and the gate electrode.

15. A high electron mobility transistor (HEMT), comprising:
a column including a channel layer and a channel supply layer which vertically extend on at least one side of the column, wherein a vertical two-dimensional electron gas (2DEG) is formed in the channel layer adjacent to an interface between the channel layer and the channel supply layer;
a first electrode contacted with the column and being electrically connected with the vertical two-dimensional electron gas (2DEG);
a second electrode contacted with the column and being electrically connected with the vertical two-dimensional electron gas (2DEG); and
a third electrode, disposed on the column;
wherein the vertical two-dimensional electron gas (2DEG) is perpendicular to a substrate surface;
wherein the substrate includes a first area, a second area, and a vertical interface between the first area and the second area, the first area higher than the second area,
wherein the vertical two-dimensional electron gas (2DEG) is formed above the second area, and the vertical two-dimensional electron gas (2DEG) has a larger height than the vertical interface, and
wherein the vertical in is a (111) plane of Si, a (0001) plane of $Al_2O_3$, a (0001) plane or a (000-1) plane of SiC, or a (0001) plane of GaN intrinsic substrate.

16. The high electron mobility transistor according to claim 15, the first electrode or the second electrode is a source electrode or a drain electrode.

17. The high electron mobility transistor according to claim 15, further comprising a gate insulating layer between the channel supply layer and the third electrode.

18. The high electron mobility transistor according to claim 15, wherein the first electrode, the second electrode and the third electrode are on the side of the column.

19. The high electron mobility transistor according to claim 15, wherein the first electrode is on a top of the column.

20. The high electron mobility transistor according to claim 15, wherein the second electrode is on a bottom of the column.

21. The high electron mobility transistor according to claim 19, wherein an area of the second electrode is larger than a base area of the column.

22. A method of manufacturing a high electron mobility transistor (HEMT), comprising:
forming a vertical interface which is perpendicular to a substrate surface;
forming a channel layer outside of the vertical interface; and
forming a channel supply layer outside of the channel layer, wherein a vertical two-dimensional electron gas (2DEG) is formed in the channel layer adjacent to an interface between a semiconductor channel layer and the channel supply layer; and
forming a first electrode and a second electrode electrically connected to the two-dimensional electron gas (2DEG), and a gate electrode outside of the channel supply layer;
wherein the vertical interface is a (111) plane of Si, a (0001) plane of $Al_2O_3$, a (0001) plane or a (000-1) plane of SiC, or a (0001) plane of GaN intrinsic substrate;
wherein the substrate includes a first area and a second area, the first area is higher than the second area, the vertical two-dimensional electron gas (2DEG) is formed above the second area and the vertical two-dimensional electron gas (2DEG) has a larger height than the vertical interface.

23. The method according to claim 22, wherein the vertical interface is formed on the substrate.

24. The method according to claim 22, further comprising forming a gate insulating layer between a channel supply layer and the gate electrode.

25. The method according to claim 22 further comprising, before forming the first electrode and the second electrode electrically connected to the two-dimensional electron gas (2DEG), transversely etching the channel supply layer or the channel supply layer and a part of the channel layer.

26. The method according to claim 22, further comprising forming a nucleation layer on the vertical interface, wherein Chlorine gas is aerated while forming a nucleation layer.

27. The method according to claim 22, further comprising,
forming the second electrode and gate electrode electrically connected to the two-dimensional electron gas (2DEG);
etching the substrate or a part of the substrate; and
forming the first electrode under the channel layer and the channel supply layer.

* * * * *